United States Patent [19]
Mehr et al.

[11] Patent Number: 5,818,232
[45] Date of Patent: Oct. 6, 1998

[54] SADDLE-SHAPED MULTITURN RF COILS FOR NMR PROBE

[75] Inventors: Knut Gustav Mehr, San Francisco; James Patrick Finnigan, Santa Clara, both of Calif.

[73] Assignee: Varian Associates, Inc., Palo Alto, Calif.

[21] Appl. No.: 841,902

[22] Filed: Apr. 17, 1997

[51] Int. Cl.$^6$ .................................................. G01V 3/00
[52] U.S. Cl. .......................................... 324/318; 324/314
[58] Field of Search ..................... 324/318, 322, 324/300, 314, 307, 309, 316; 128/653.2

[56] References Cited

U.S. PATENT DOCUMENTS

| | | | |
|---|---|---|---|
| 4,743,852 | 5/1988 | Ikeda | 324/318 |
| 5,689,188 | 11/1997 | Claasen-Vujcic | 324/318 |
| 5,696,449 | 12/1997 | Boskamp | 324/318 |

*Primary Examiner*—Louis M. Arana

[57] ABSTRACT

A symmetric RF coil for use in a probe for NMR apparatus comprises an odd number of turns having generally straight portions and arc-shaped portions wound alternately in series on the curved surface of a cylindrical sample region. An additional pair of arc-shaped segments connect to the outermost turn to form continuous end rings, and to split the current on the outermost turn to the continuous end rings. Such an RF probe coil possesses material symmetry provided by the additional arc-shaped segments and RF symmetry as a result of the symmetry in current flow generated by the split in current of the outermost turn to the continuous end rings. The symmetric odd-turn RF coil achieves NMR performance at the same level of even-turn coils with high RF homogeneity, and is suitable for high resolution NMR applications. The coil inductance of the present invention bridges the gap between even-turn coils, and facilitates improved optimization of the resonance circuits over the entire operating range.

20 Claims, 4 Drawing Sheets

SADDLE-SHAPED MULTITURN RF COILS FOR NMR PROBE

FIELD OF THE INVENTION

This invention relates to coils for use in a nuclear magnetic resonance (NMR) probe, and more particularly to saddle-shaped multiturn radio frequency (RF) coils with odd numbers of turns which provide high RF and mechanical symmetry.

BACKGROUND OF THE INVENTION

An NMR probe holds a sample placed in a uniform polarizing magnetic field in NMR spectrometry. A coil is disposed close to the sample within the probe to apply an exciting RF magnetic field to the sample. The resultant resonance signal of the sample is picked up by the coil and delivered to a receiver circuit. The receiver circuit generates an output signal. A computer takes the Fourier transform of the signal to obtain an NMR spectrum.

The degree of coupling between the RF coil and the sample largely determines the sensitivity of the NMR spectrometer using the NMR probe. This coupling is governed in turn by the shape and structure of the coil. An NMR spectrometer typically uses a superconductive magnet with a cylindrical saddle-shaped coil such as that shown in FIG. 1. In such a configuration, two spiral coil turns 1 and 2 are symmetrically arranged about the Z axis of a cylinder and define a curved surface of a radius R for the cylinder. A sample tube (not shown) holding a sample is disposed in the cylinder defined by the two spiral coil turns 1 and 2. The coil portion 1 consists of a pair of straight turns 1A extending parallel to the Z axis and a pair of arc-shaped portions 1B each lying in a plane perpendicular to the Z axis. The coil turn 2 similarly consists of a pair of straight portions 2A and a pair of arc-shaped portions 2B. The pairs of straight portions 1A and 2A are disposed on the periphery of the circle defined by the radius R in a symmetrical relation with respect to the Y–Z plane containing the Z axis, as best seen in the plan view of FIG. 2 taken parallel to an X–Y plane perpendicular to the Z axis. The two spiral coil portions 1 and 2 set up an RF magnetic field in the X–Z plane which contains the X axis and the Z axis, and meets the Y axis at right angles. FIG. 3 illustrates the coil which is formed by stamping out a structure from an electrically conductive sheet.

The symmetric configuration illustrated in FIGS. 1 and 2 limits the number of coil turns to even numbers, i.e., 2 (FIG. 3), 4 (FIG. 4), 6, etc. The resonance frequency is a function of the inductance of the NMR probe coil. An undesirable situation arises where two coil turns are not sufficient and four coil turns are too high to achieve the desired resonance frequency. To overcome this difficulty, U.S. Pat. No. 4,743,852 to Ikeda introduces an unsymmetrical probe coil that has an odd number of turns.

An example of an unsymmetrical probe RF coil is shown in FIGS. 5–7, which is wound around a cylindrical sample region with three turns to produce an RF magnetic field in a direction perpendicular to the Z axis of the cylinder. The coil comprises a plurality of nonmagnetic and electrically conductive straight portions extending parallel to the Z axis and arc-shaped, nonmagnetic and electrically conductive portions which connect the straight portions in series to form the probe coil. The number of pairs of straight portions is 2n+1, where n is an integer equal to or greater than 1, i.e., 3 (FIG. 7), 5 (FIG. 8), 7, 9, etc.

Symmetric RF coils with even numbers of turns (i.e., 2, 4, 6, . . . ) are preferred as NMR observer coils or decoupler coils since the symmetry improves the RF homogeneity and minimizes the distortion of the static magnetic field. The inductance varies roughly with the square of the number of turns. The available inductance values for a given even-turn coil size are very limited and the step size from one even-turn coil to the next is very coarse, making it difficult to achieve the desired resonance frequency. On the other hand, unsymmetric RF coils with odd numbers of turns are less desirable for high resolution NMR application due to their unsymmetrical distribution of RF current and material. Shimming efforts to correct the distortions of the static magnetic field of the unsymmetric coils will consume significantly more time than with symmetric coils. In addition, the unsymmetric RF current path of such a coil results in a reduced RF homogeneity of the polarizing magnetic field.

It is understood that the RF coil described herein may be employed with benefit in either of the main applications of NMR application, e.g. the chemical analysis of samples, or the spatial distribution of resonant signal over a sample.

SUMMARY OF THE INVENTION

There is therefore a need for an RF coil with odd number of turns and substantially equivalent material and RF symmetry as found in even-number RF coils.

It is a feature of this invention to provide an RF coil with odd number of turns and having the current path of the outermost return arcs split to form a continuous end ring to achieve symmetry in current flow and material distribution.

In accordance with one aspect of the present invention, an NMR probe coil comprises a plurality of nonmagnetic and electrically conductive, generally straight portions extending generally parallel to an axis, a plurality of nonmagnetic and electrically conductive, arc-shaped portions, and a pair of nonmagnetic and electrically conductive segments. The generally straight portions have (2n+1) pairs with n being an integer greater than or equal to 1. There are also (2n+1) pairs of the arc-shaped portions. n pairs of the (2n+1) pairs form a first group of generally straight portions and (n+1) pairs of the (2n+1) pairs form a second group of generally straight portions. In the second group, n pairs of generally straight portions are generally symmetrically disposed from the n pairs of generally straight portions in the first group. The arc-shaped portions are alternately connected in series with the generally straight portions. n pairs of the arc-shaped portions form a first set of arc-shaped portions which corresponds to the first group of generally straight portions. (n+1) pairs of the arc-shaped portions form a second set of arc-shaped portions which corresponds to the second group of generally straight portions, with n pairs of the (n+1) pairs generally symmetrically disposed from the n pairs of the first set. One remainder pair of the (n+1) pairs is an outermost pair of arc-shaped portions. A first segment of the pair of segments is connected with one of the outermost arc-shaped portions at two ends to form a first closed ring. A second segment is connected with the other one of the outermost arc-shaped portions at two ends to form a second closed ring.

Another aspect of this invention is an RF coil for NMR spectrometry which comprises a first group of n pairs of nonmagnetic and electrically conductive straight portions, a second group of (n+1) pairs of nonmagnetic and electrically conductive straight portions, a first set of (2n) nonmagnetic and electrically conductive curved portions, a second set of (2n+2) nonmagnetic and electrically conductive curved portions, and a first and second nonmagnetic and electrically conductive segments, where n is an integer greater than or equal to 1. The first group of straight portions extend generally parallel to an axis and are disposed generally on a first side of a dividing plane defined by the axis. The second group of straight portions extend generally parallel to the axis and are disposed generally on a second side of the dividing plane opposite from the first side. n pairs of the (n+1) pairs in the second group are generally symmetric with respect to the n pairs of the first group. One remaining pair of the (n+1) pairs are disposed outermost of the n pairs of the second group. The first set of (2n) curved portions are disposed generally on the first side of the dividing plane. Each of the (2n) curved portions are connected between alternate pairs of the n pairs of straight portions in the first group to form a first continuous path, including one outer curved portion having an end connected to one of the outermost straight portions in the second group. The second set of (2n+2) curved portions are disposed generally on the second side of the dividing plane. Each of (2n+2) curved portions are connected between alternate pairs of the (n+1) pairs of straight portions in the second group to form a second continuous path connected in series with the first continuous path through the outer curved portion in the first set. The (2n+2) curved portions include 2 outermost curved portions with one connected to one of the outermost straight portions and the other connected to both outermost straight portions in the second group. The first and second segments are disposed generally on the first side of the dividing plane. The first segment is connected with one of the outermost curved portions to form a first closed loop. The second segment is connected with the other outermost curved portion to form a second closed loop.

Yet another aspect of the present invention is an NMR probe coil wound on the curved surface of a generally cylindrical sample region. The NMR probe coil comprises a plurality of nonmagnetic and electrically conductive straight portions, a plurality of nonmagnetic and electrically conductive arc-shaped portions, and a pair of nonmagnetic and electrically conductive arc-shaped segments. The straight portions extend generally parallel to a Z axis of the generally cylindrical sample region. The straight portions are arranged in (2n+1) pairs with n being an integer greater than or equal to 1. The straight portions are divided into two groups within which the straight portions are substantially equally spaced from each other on the curved surface of the generally cylindrical sample region and with each pair divided between the two groups. The two groups of straight portions are substantially symmetrical with respect to the Z axis. The arc-shaped portions connect the straight portions in series to produce an RF magnetic field in a direction defined by an X axis perpendicular to the Z axis. Each pair of the straight portions are joined by one arc-shaped portion. One straight portion of each pair is disposed on a first side of an XZ plane defined by the X axis and Z axis and the other straight portion of each pair is disposed on a second side of the XZ plane opposite from the first side. One of the pairs of straight portions intersects a Y axis which is perpendicular to the X axis and Z axis. The arc-shaped portions are substantially symmetrical with respect to the XZ plane. The pair of arc-shaped segments includes a first arc-shaped segment connected at two ends with one of the arc-shaped portions and a second arc-shaped segment connected at two ends with another of the arc-shaped portions to achieve substantial symmetry of the arc-shaped portions and arc-shaped segments with respect to a YZ plane defined by the Y axis and Z axis.

BRIEF DESCRIPTION OF THE DRAWINGS

The preferred embodiments of this invention, illustrating all their features, will now be discussed in detail. These embodiments depict the novel and nonobvious RF coils of this invention shown in the accompanying drawings, which are included for illustrative purposes only. These drawings include the following figures, with like numerals indicating like parts.

DETAILED DESCRIPTION OF THE INVENTION

Figure 1:
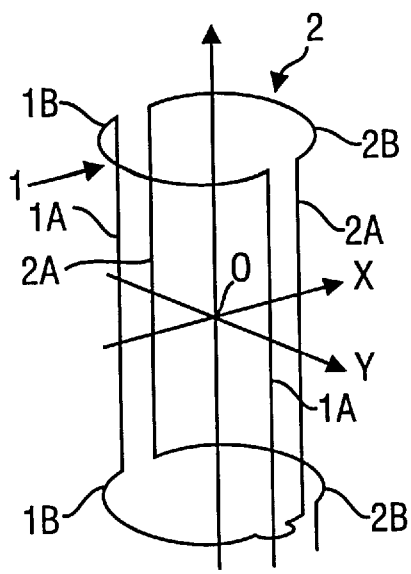
FIG. 1 is a perspective view schematically illustrating a saddle-shaped multiturn prior art coil with two turns.
Figure 2:
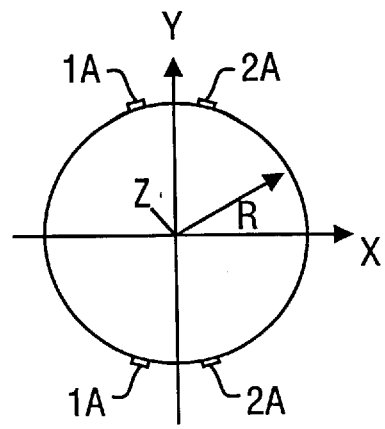
FIG. 2 is a plan view of the saddle-shaped coil of FIG. 1.
Figure 3:
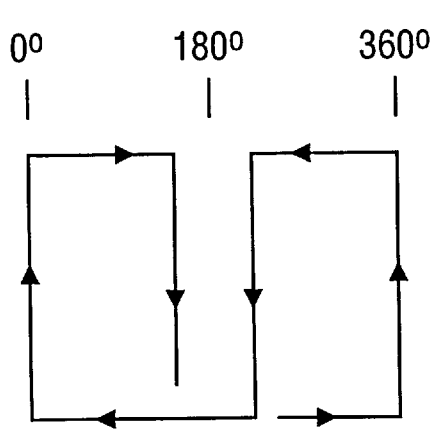
FIG. 3 is an elevational view schematically illustrating a stamped saddle-shaped multiturn prior art coil with two turns.
Figure 4:
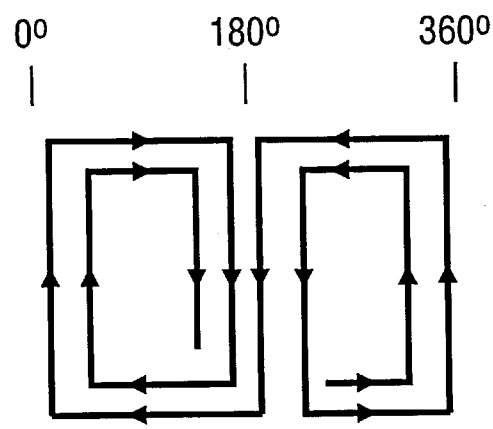
FIG. 4 is an elevational view schematically illustrating a stamped saddle-shaped multiturn prior art coil with four turns.
Figure 5:
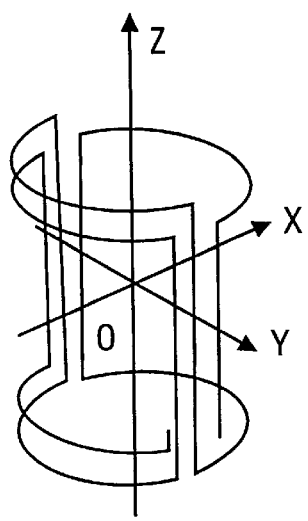
FIG. 5 is a perspective view schematically illustrating a saddle-shaped multiturn prior art coil with three turns.
Figure 9:
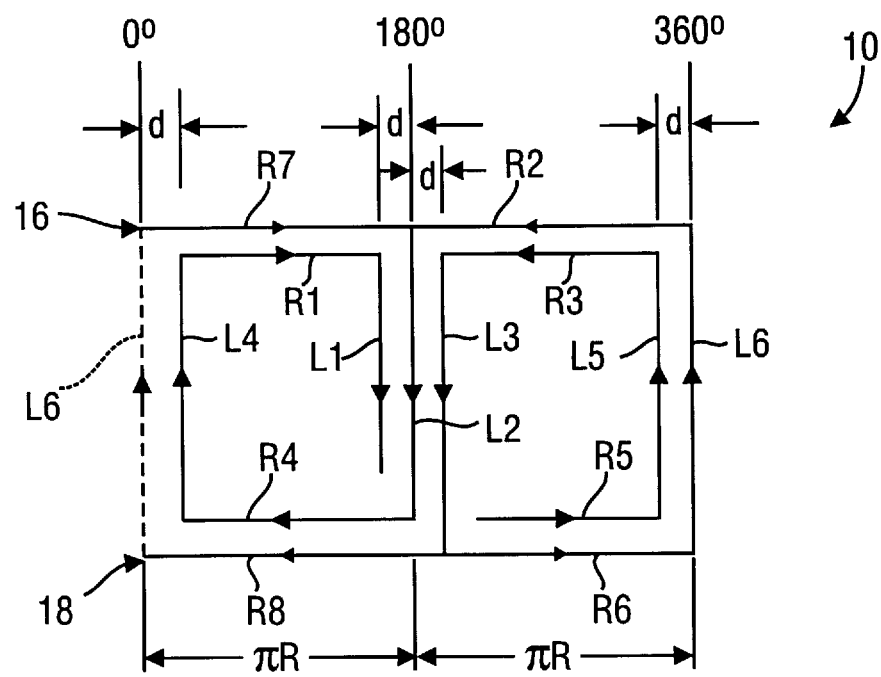
FIG. 9 is an elevational view schematically illustrating a stamped saddle-shaped multiturn coil of the present invention with three turns and symmetry.
Figure 10:
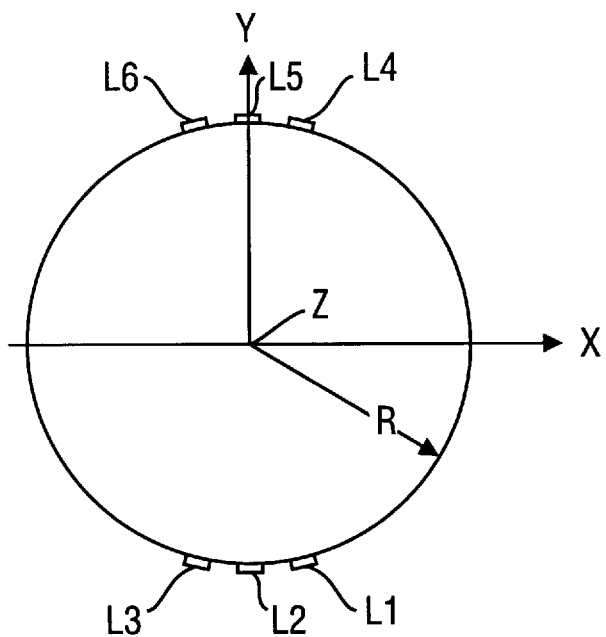
FIG. 10 is a plan view of the saddle-shaped coil of FIG. 9 shaped into a cylinder about the Z axis.

Referring to FIGS. 9 and 10, a symmetric three-turn saddle-shaped RF coil 10 may be formed by stamping out a structure as shown in FIG. 9 and shaping it into a generally cylindrical form similar to those shown in FIGS. 1 and 5. The coil 10 includes generally straight portions L1–L6 that extend generally parallel to the Z axis of the cylinder and arc-shaped or curved portions R1–R6 that connect the straight portions L1–L6 in series to form a continuous current path. Two additional arc-shaped portions or segments R7 and R8 are included to form the coil 10. The arc-shaped portion R7 connects to the top outermost arc-shaped portion R2 to form a top continuous end ring 16, while the arc-shaped portion R8 connects to the bottom outermost arc-shaped portion R4 to form a bottom continuous end ring 18. The straight portions L2 and L5 desirably intersect the Y axis, while the straight portions L3 and L6 are disposed on one side of the YZ plane and the straight portions L1 and L4 are disposed on the other side of the YZ plane. The arc-shaped portions R1, R4 are desirably generally symmetric with the arc-shaped portions R3, R5 relative to the YZ plane. The arc-shaped portions R2, R6 are also desirably generally symmetric with the arc-shaped portions or segments R7, R8 relative to the YZ plane. The arc-shaped portions R1–R8 are desirably generally symmetric with respect to the XZ plane.

The radius of the cylinder is R. The arc-shaped portion R2 that connects the straight portion L2 to the straight portion L6 from 180° to 360° has a length of R. The arc-shaped portion R7 that connects the straight portion L2 to the straight portion L6 from 0° to 180° also has a length of R. The straight portions L1 and L2 and straight portion L2 and L3 are desirably equally spaced apart by a distance of d; as are the straight portions L5 and L6 and straight portions L4 and L6. The length of the arc-shaped portion R4 is R−d. All the straight portions L1–L6 and arc-shaped portions R1–R8 desirably have substantially the same size in cross-section, e.g., substantially the same radius for a circular cross-section or substantially the same width for a sheet cross-section. When these portions are shaped into a cylinder, the straight portions L1–L6 are arranged about the Z axis of the cylinder as shown in FIG. 10. As shown in FIGS. 9 and 10, the straight portions L1–L6 are desirably disposed generally symmetrically about the Z axis, and more desirably exactly symmetrically about the Z axis. The straight portions L1–L6 and arc-shaped portions R1–R8 may be supported on a bobbin of a hollow cylinder, desirably by evaporation. In another embodiment, the straight portions L1–L6 and arc-shaped portions R1–R8 are formed by a printed circuit supported by an insulating substrate, where the insulating substrate is flexible and can be bent. In yet another embodiment, the straight portions L1–L6 and arc-shaped portions R1–R8 are sufficiently strong mechanically to support themselves.

The coil 10 of FIG. 9 has an odd number of turns formed by grouping together certain straight and arc-shaped portions. The first turn is formed by R5, L5, R3, and L3 connected in series. The second turn includes R4, L4, R1, and L1 connected in series. The third turn has a pair of outermost loops split from the straight portion L6. The first loop includes R6, L6, R2, and L2; while the second loop is formed by R8, L6, R7, and L2. There are 3 pairs of straight portions, as in the unsymmetric 3-turn coil of FIGS. 5–7. The first pair (L1, L4) forms a first group, while the second and third pairs (L3, L5; L2, L6) constitute a second group. The second pair (L3, L5) is generally symmetric with the first pair (L1, L2), with the third pair (L2, L6) as the outermost pair. There are 3 pairs of arc-shaped portions: a first pair (R1, R4) forming a first set and corresponding to the first pair (L1, L4) in the first group; and a second pair (R3, R5) and third pair (R2, R6) constituting a second set and corresponding respectively to the second and third pairs (L3, L5; L2, L6) of the second group. The second pair (R3, R5) is generally symmetric with the first pair (R1, R2), with the third pair (R2, R6) as the outermost pair. Unlike the unsymmetric 3-turn coil, however, there is mechanical or material symmetry in the coil 10 similar to the symmetry in even-turn coils illustrated in FIGS. 1–4, as well as RF symmetry in electrical current as discussed below.

Figure 6:
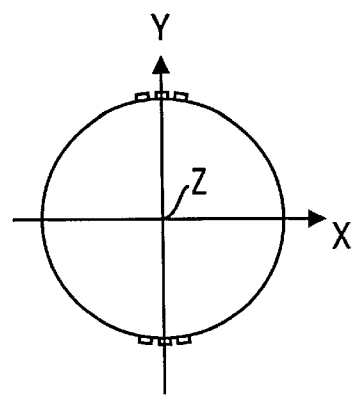
FIG. 6 is a plan view of the saddle-shaped prior art coil of FIG. 5.
Figure 7:
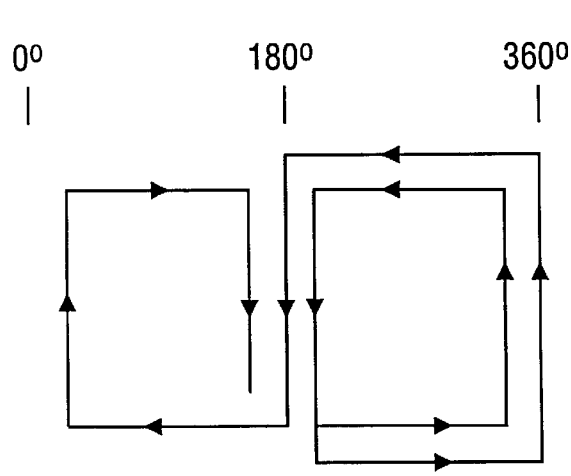
FIG. 7 is an elevational view schematically illustrating a stamped saddle-shaped multiturn prior art coil with three turns.

This coil 10 differs from the three-turn coil of FIGS. 5–7 by including arc-shaped portions or segments R7 and R8 connected to the straight portion L6 to form the top and bottom continuous end rings 16, 18 that create the pair of split loops. As indicated by the arrows, the current of the straight portion L3 is split into currents flowing through arc-shaped portions R6 and R8 that recombine into a current through the straight portion L6. The current again splits from the straight portion L6 into currents flowing through arc-shaped portions R2 and R7, which again recombine at the straight portion L2. Because of the current split, the first and second loops combine to form the third turn and the coil 10 is symmetric in current flow, as that present in the even-turn coils of FIGS. 1–4. Consequently, the RF magnetic field is produced in the direction of the X axis around the center or origin of the cylindrical region in which a sample is placed. This RF magnetic field is generally the same in magnitude as the RF magnetic field produced by the 3-turn unsymmetric coil of FIGS. 5–7. Because of the RF symmetry of the coil 10 of FIGS. 9 and 10, however, the RF magnetic field produced in the coil 10 has superior RF homogeneity and lineshape performance over the unsymmetric 3-turn coil of FIGS. 5–7. The present coil 10 achieves NMR performance equal to that for even-turn coils, and is suitable for high resolution NMR applications.

Figure 8:
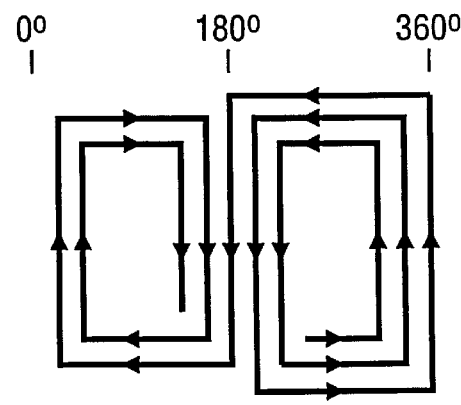
FIG. 8 is an elevational view schematically illustrating a stamped saddle-shaped multiturn coil with five turns.
Figure 11:
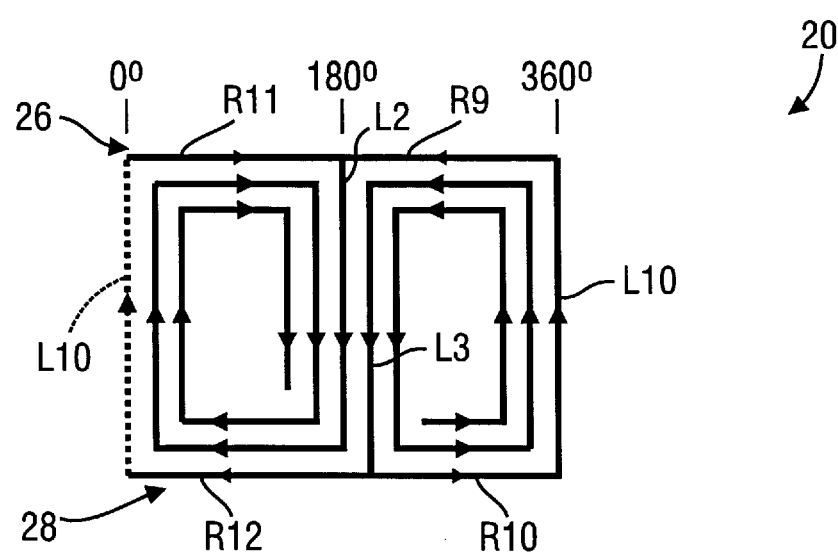
FIG. 11 is an elevational view schematically illustrating a stamped saddle-shaped multiturn coil of the present invention with five turns and symmetry.

The present invention can be extended to other odd-turn coils, such as the symmetric 5-turn coil with 5 pairs of straight portions illustrated in FIG. 11. Similar to the 3-turn coil 10, the symmetric 5-turn coil 20 differs from the unsymmetric 5-turn coil of FIG. 8 by including arc-shaped portions or segments R11 and R12 connected respectively to arc-shaped portions R9 and R10 between the straight portions L2 and L10 to form the pair of split loops (R10, L10, R9, L2; and R12, L10, R11, L2) with top and bottom continuous end rings 26, 28. As indicated by the arrows, the current of the straight portion L3 is split into currents flowing through arc-shaped portions R10 and R12 that recombine into a current through the straight portion L10. The current again splits from the straight portion L10 into currents flowing through arc-shaped portions R9 and R11, which again recombine at the straight portion L2. Because of the current split, the pair of split loops combine to form the fifth turn and the coil 20 possesses mechanical and RF symmetry, at the same level as that present in the even-turn coils of FIGS. 1–4.

The same principle of splitting the current of the outermost turn on the continuous end rings applies to other symmetric odd-turn coils (9, 11, . . . ). In such embodiments, the number of pairs of straight portions is 2n+1, where n is an integer greater than or equal to 1. The number of pairs of arc-shaped portions is 2n+2, where 2n+1 pairs connect the 2n+1 straight portions in series, one arc-shaped portion of the remaining pair connects one of the two outermost arc-shaped portions to form a first continuous ring, and the other arc-shaped portion of the remaining pair connects the other outermost arc-shaped portion to form a second continuous ring. Therefore, the coil inductance of the present invention bridges the gap between even-turn coils, and facilitates improved optimization of the resonance circuits over the entire operating range.

It will be understood that the above-described arrangements of apparatus and the methods therefrom are merely illustrative of applications of the principles of this invention and many other embodiments and modifications may be made without departing from the spirit and scope of the invention as defined in the claims.

What is claimed is:

1. An NMR probe having a coil comprising:

a plurality of nonmagnetic and electrically conductive, generally straight portions extending generally parallel to an axis, said generally straight portions having (2n+1) pairs with said n being an integer greater than or equal to 1, n pairs of said (2n+1) pairs forming a first group of generally straight portions, (n+1) pairs of said (n+1) pairs forming a second group of generally straight portions which includes n pairs of generally straight portions generally symmetrically disposed from said n pairs of said first group;

a plurality of nonmagnetic and electrically conductive, arc-shaped portions of (2n+1) pairs, said arc-shaped portions alternately connected in series with said generally straight portions, n pairs of said arc-shaped portions forming a first set of arc-shaped portions which corresponds to said first group of generally straight portions, (n+1) pairs of said arc-shaped portions forming a second set of arc-shaped portions which corresponds to said second group of generally straight portions with n pairs of said (n+1) pairs generally symmetrically disposed from said n pairs of said first set and one remainder pair being an outermost pair of arc-shaped portions; and a pair of nonmagnetic and electrically conductive segments having a first segment connected with one said outermost arc-shaped portion at two ends to form a first closed ring and a second segment connected with the other said outermost arc-shaped portion at two ends to form a second closed ring.

2. The NMR probe of claim 1, wherein said first group of generally straight portions and said first set of arc-shaped portions are generally disposed on a first side of a symmetry plane defined by said axis, and said n pairs of said second group of generally straight portions and said second set of arc-shaped portions are generally disposed on a second side of said symmetry plane opposite from said first side.

3. The NMR probe of claim 2, wherein said first and second segments are generally disposed on said first side of said symmetry plane.

4. The NMR probe of claim 1, wherein said generally straight portions are generally uniform in cross-section.

5. The NMR probe of claim 1, wherein said generally straight portions have generally circular cross-sections.

6. The NMR probe of claim 1, wherein one half of said first group of generally straight portions are generally equally spaced from each other by a first distance and the other half of said first group of generally straight portions are generally equally spaced from each other by a second distance, and one half of said second group of generally straight portions are generally equally spaced from each other by a third distance and the other half of said second group of generally straight portions are generally equally spaced from each other by a fourth distance.

7. The NMR probe of claim 6, wherein said first distance, second distance, third distance, and fourth distance are substantially the same.

8. The NMR probe of claim 1, wherein said arc-shaped portions and said first and second segments are generally uniform in cross-section.

9. The NMR probe of claim 1, wherein said generally straight portions and arc-shaped portions are generally uniform in cross-section.

10. The NMR probe of claim 1, wherein said generally straight portions, arc-shaped portions, and first and second segments are wound on a curved surface of a generally cylindrical sample region.

11. An NMR probe comprising an RF coil, said coil comprising:

a first group of n pairs of nonmagnetic and electrically conductive straight portions extending generally parallel to an axis and disposed generally on a first side of a dividing plane defined by said axis, said n being an integer greater than or equal to 1;

a second group of (n+1) pairs of nonmagnetic and electrically conductive straight portions extending generally parallel to said axis, n pairs of said (n+1) pairs disposed generally on a second side of said dividing plane opposite from said first side and being generally symmetric with respect to said n pairs of said first group and one remaining pair of said (n+1) pairs being disposed outermost of said n pairs of said second group;

a first set of (2n) nonmagnetic and electrically conductive curved portions disposed generally on said first side of said dividing plane, each of said (2n) curved portions connected between alternate pairs of said n pairs of straight portions in said first group to form a first continuous path, including one outer curved portion having an end connected to one of said outermost straight portions in said second group;

a second set of (2n+2) nonmagnetic and electrically conductive curved portions disposed generally on said second side of said dividing plane, each of said (2n+2) curved portions connected between alternate pairs of said (n+1) pairs of straight portions in said second group to form a second continuous path connected in series with said first continuous path through said outer curved portion in said first set, said (2n+2) curved portions including 2 outermost curved portions with one outermost curved portion connected to one of said outermost straight portions and the other outermost curved portion connected to both said outermost straight portions in said second group;

a first and second nonmagnetic and electrically conductive segments disposed generally on said first side of said dividing plane, said first segment connected with one said outermost curved portion to form a first closed loop, said second segment connected with the other said outermost curved portion to form a second closed loop.

12. The NMR probe of claim 11, wherein said straight portions, curved portions, and first and second segments are wound on a curved surface of a generally cylindrical sample region.

13. The NMR probe of claim 11, wherein a first half of said first group of straight portions are generally equally spaced from each other by a first distance and the other half of said first group of straight portions are generally equally spaced from each other by a second distance, and a first half of said second group of straight portions are generally equally spaced from each other by a third distance and a second half of said second group of straight portions are generally equally spaced from each other by a fourth distance.

14. The NMR probe of claim 13, wherein said first distance, second distance, third distance, and fourth distance are substantially equal.

15. The NMR probe of claim 11, wherein said straight portions are conductors with a substantially uniform circular cross-section.

16. An NMR probe comprising a coil wound on the curved surface of a generally cylindrical sample region, said NMR probe coil comprising:

a plurality of nonmagnetic and electrically conductive straight portions extending generally parallel to a Z axis of said generally cylindrical sample region, said straight portions being arranged in (2n+1) pairs with n being an integer greater than or equal to 1, said straight portions being divided into two groups within which said straight portions are substantially equally spaced from each other on said curved surface of said generally cylindrical sample region and with each said pair divided between said two groups, said two groups of straight portions being substantially symmetrical with respect to said Z axis;

a plurality of nonmagnetic and electrically conductive arc-shaped portions connecting said straight portions in series to produce an RF magnetic field in a direction defined by an X axis perpendicular to said Z axis, each said pair of straight portions being joined by one said arc-shaped portion, one straight portion of each said pair disposed on a first side of an XZ plane defined by said X axis and Z axis and the other straight portion of each said pair disposed on a second side of said XZ plane opposite from said first side, one of said pairs of straight portions intersecting a Y axis which is perpendicular to said X axis and Z axis, said arc-shaped portions being substantially symmetrical with respect to said XZ plane;

a pair of nonmagnetic and electrically conductive arc-shaped segments, which includes a first arc-shaped segment connected at two ends with one of said arc-shaped portions and a second arc-shaped segment connected at two ends with another of said arc-shaped portions to achieve substantial symmetry of said arc-shaped portions and said arc-shaped segments with respect to a YZ plane defined by said Y axis and Z axis.

17. The NMR probe of claim 16, wherein said arc-shaped portions include n pairs disposed substantially on a first side of said YZ plane and (n+1) pairs disposed substantially on a second side of said YZ plane opposite from said first side, and said pair of arc-shaped segments are disposed substantially on said first side and connected to an auxiliary pair of said (n+1) pairs of arc-shaped portions on said second side.

18. The NMR probe of claim 17, wherein said pair of arc-shaped segments are disposed outermost of said n pairs of arc-shaped portions on said first side and said auxiliary pair of arc-shaped portions are disposed outermost of said n pairs of arc-shaped portions on said second side.

19. The NMR probe of claim 17, wherein said n pairs of arc-shaped portions on said first side are divided into two sets within which said arc-shaped portions are substantially equally spaced from each other on said curved surface of said generally cylindrical sample region and with each said pair divided between said two sets, and said (n+1) pairs of arc-shaped portions on said second side are divided into two divisions within which said arc-shaped portions are substantially equally spaced from each other on said curved surface of said generally cylindrical sample region and with each said pair divided between said two divisions.

20. The NMR probe of claim 16, wherein said arc-shaped portions and arc-shaped segments are substantially parallel to said XY plane.

* * * * *